(12) United States Patent
Miao et al.

(10) Patent No.: US 9,337,154 B2
(45) Date of Patent: May 10, 2016

(54) SEMICONDUCTOR DEVICE AND METHOD OF MANUFACTURING THE SAME

(71) Applicant: TAIWAN SEMICONDUCTOR MANUFACTURING COMPANY LTD., Hsinchu (TW)

(72) Inventors: Chia-Chun Miao, Taichung (TW); Yen-Ping Wang, Changhua County (TW); Hao-Yi Tsai, Hsinchu (TW); Shih-Wei Liang, Taichung County (TW); Tsung-Yuan Yu, Taipei (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

(21) Appl. No.: 14/471,320

(22) Filed: Aug. 28, 2014

(65) Prior Publication Data

US 2016/0064338 A1     Mar. 3, 2016

(51) Int. Cl.
*H01L 21/00*     (2006.01)
*H01L 23/00*     (2006.01)
*H01L 29/06*     (2006.01)
*H01L 21/78*     (2006.01)

(52) U.S. Cl.
CPC ............... *H01L 23/562* (2013.01); *H01L 21/78* (2013.01); *H01L 24/14* (2013.01); *H01L 24/94* (2013.01); *H01L 29/0692* (2013.01)

(58) Field of Classification Search
CPC ............... H01L 2924/00; H01L 2924/00014; H01L 2924/181; H01L 2924/12042; H01L 2224/32225; H01L 2924/00012; H01L 2224/73265; H01L 2224/48227; H01L 2224/16225; H01L 2224/73204; H01L 2924/014
See application file for complete search history.

(56) References Cited

U.S. PATENT DOCUMENTS

| | | | | |
|---|---|---|---|---|
| 2002/0027257 | A1* | 3/2002 | Kinsman | H01L 21/561 257/400 |
| 2005/0012208 | A1* | 1/2005 | Jang | H01L 21/563 257/730 |
| 2007/0096249 | A1* | 5/2007 | Roeper | H01L 23/147 257/528 |
| 2007/0176292 | A1* | 8/2007 | Chen | H01L 24/03 257/750 |
| 2007/0182007 | A1* | 8/2007 | Jeng | H01L 24/03 257/737 |
| 2009/0294930 | A1* | 12/2009 | Yoon | H01L 23/552 257/660 |
| 2010/0019365 | A1* | 1/2010 | Matsumura | C09J 7/02 257/678 |

* cited by examiner

*Primary Examiner* — Robert Bachner
(74) *Attorney, Agent, or Firm* — WPAT, P.C., Intellectual Property Attorneys; Anthony King

(57) ABSTRACT

A semiconductor device includes a substrate comprising a front surface, side surfaces, a back surface, and a recessed edge between the side surfaces and either the front surface or the back surface, the front surface comprising an active region, the active region comprising at least one contact pad, a polymeric member disposed and contacted with the recessed edge of the substrate, a mold disposed over the front surface of the substrate and the polymeric member, and an interface between the mold and the polymeric member.

20 Claims, 20 Drawing Sheets

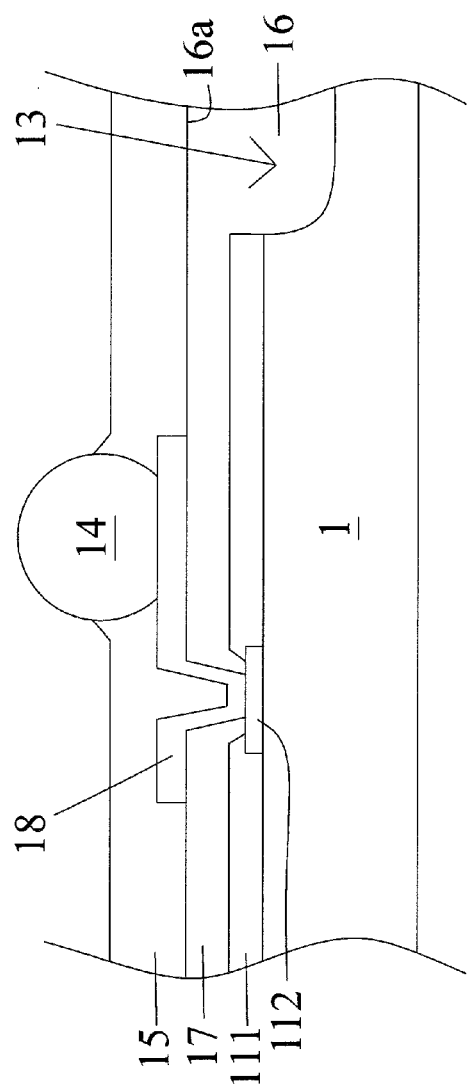
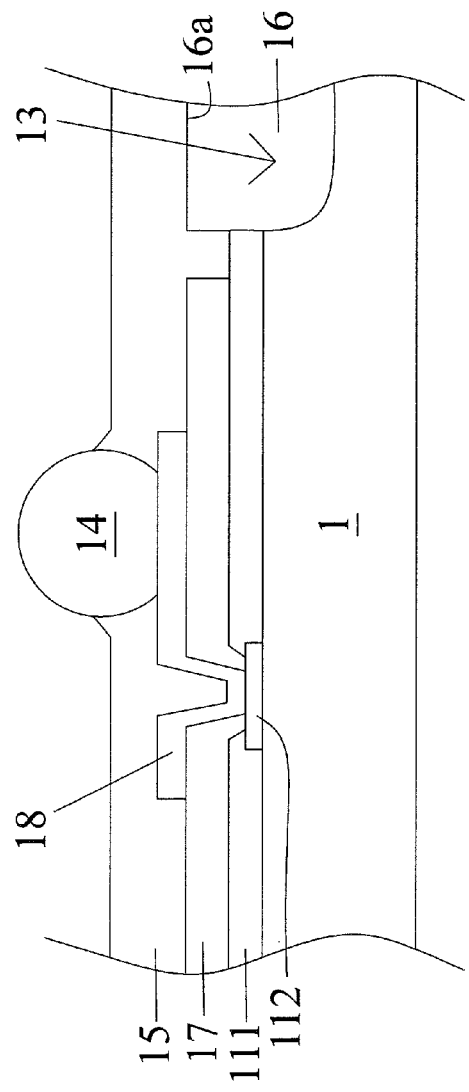

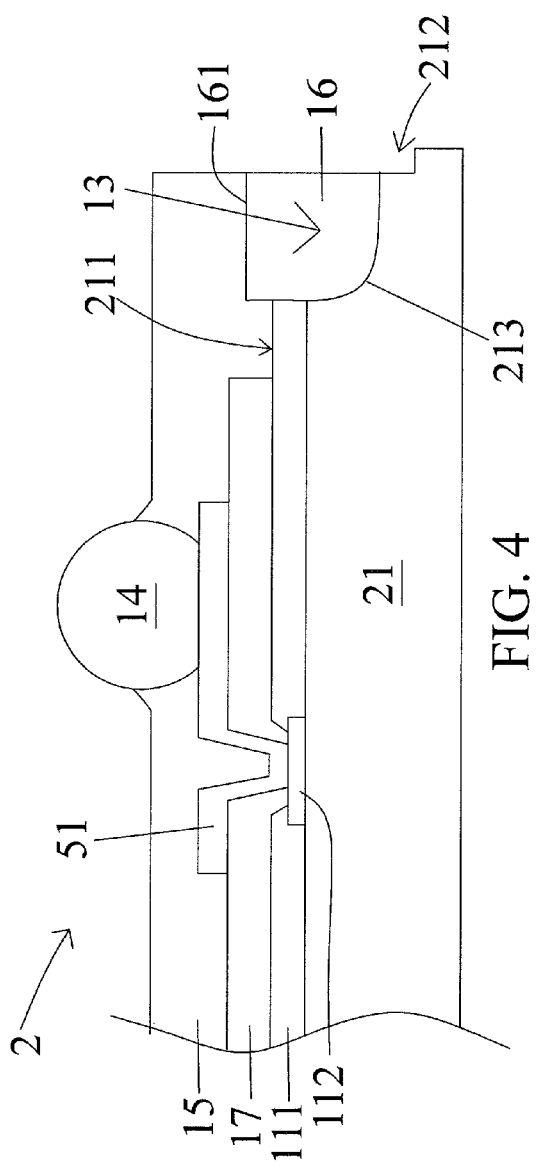
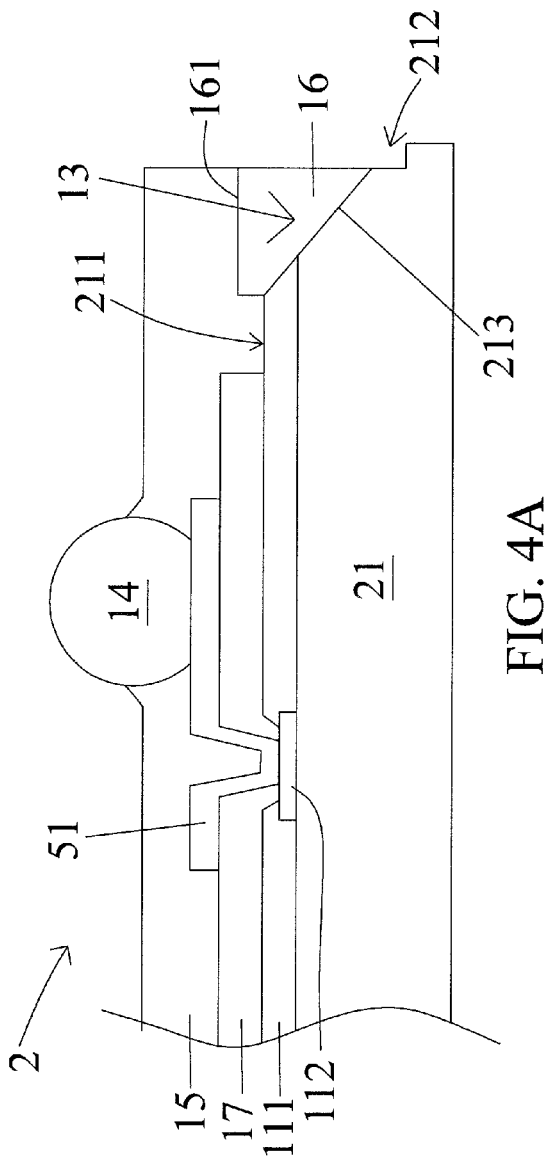

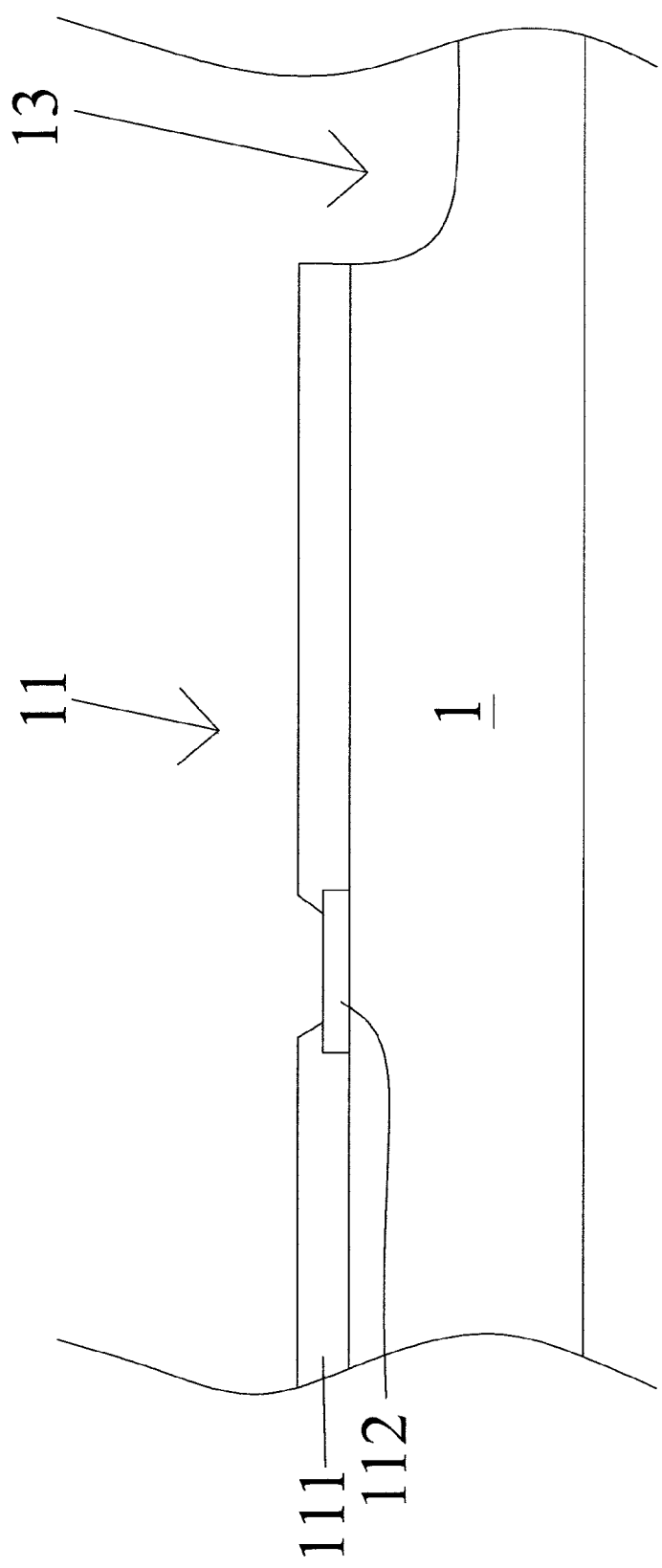

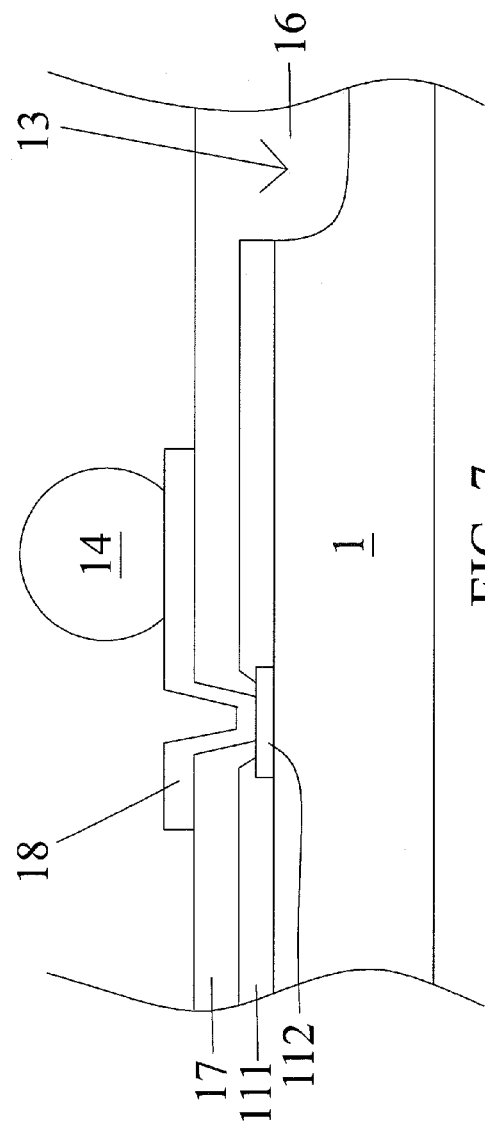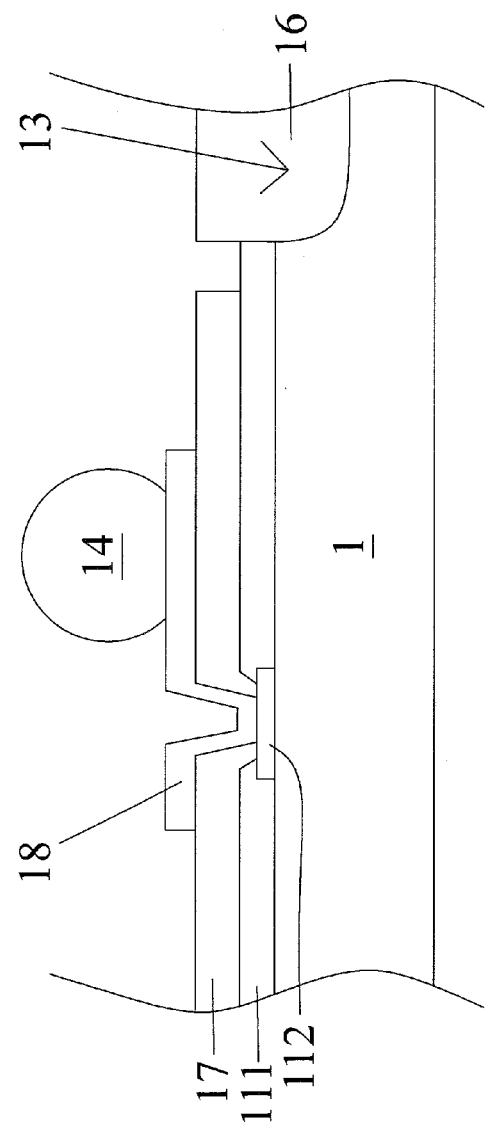

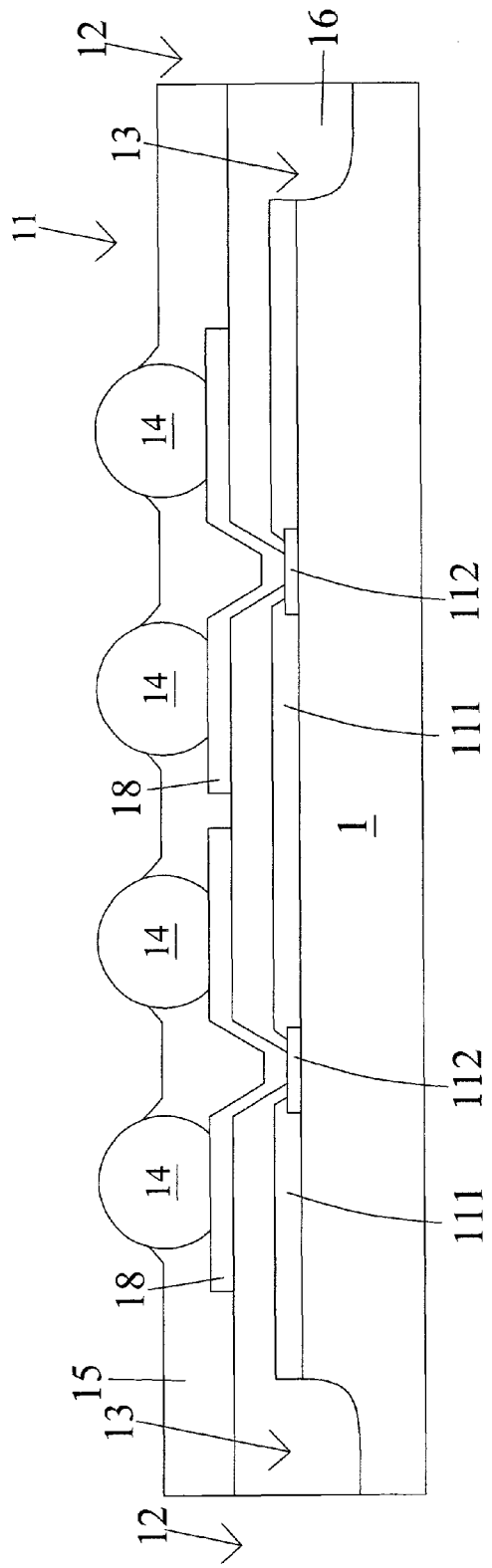
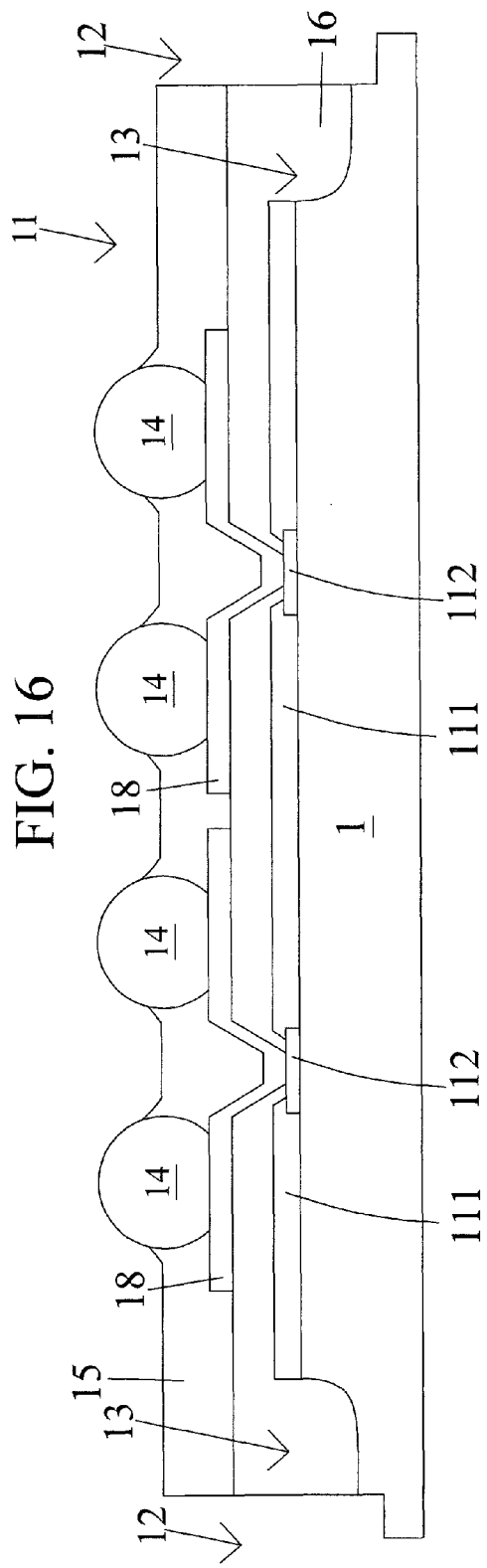
FIG. 16
FIG. 16A

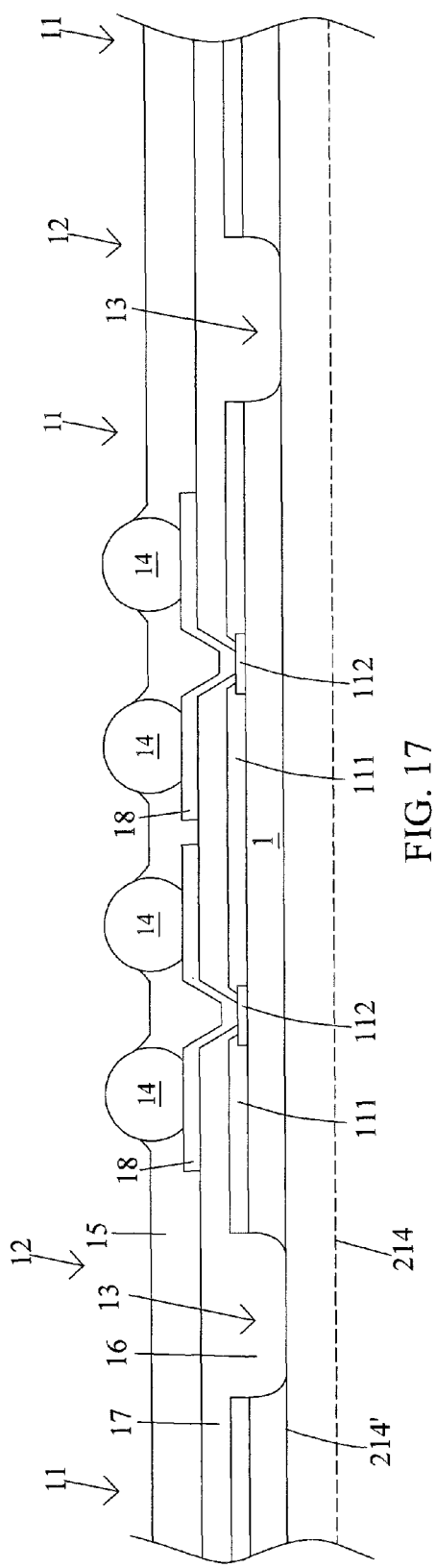
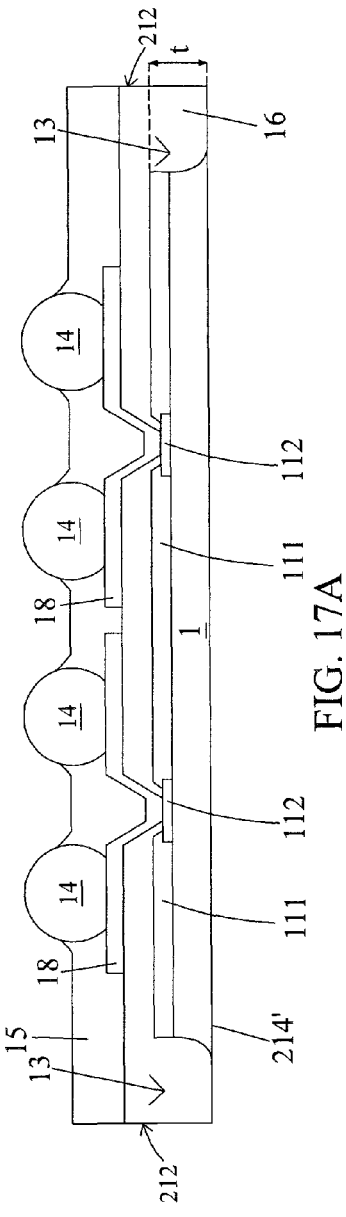
FIG. 17
FIG. 17A

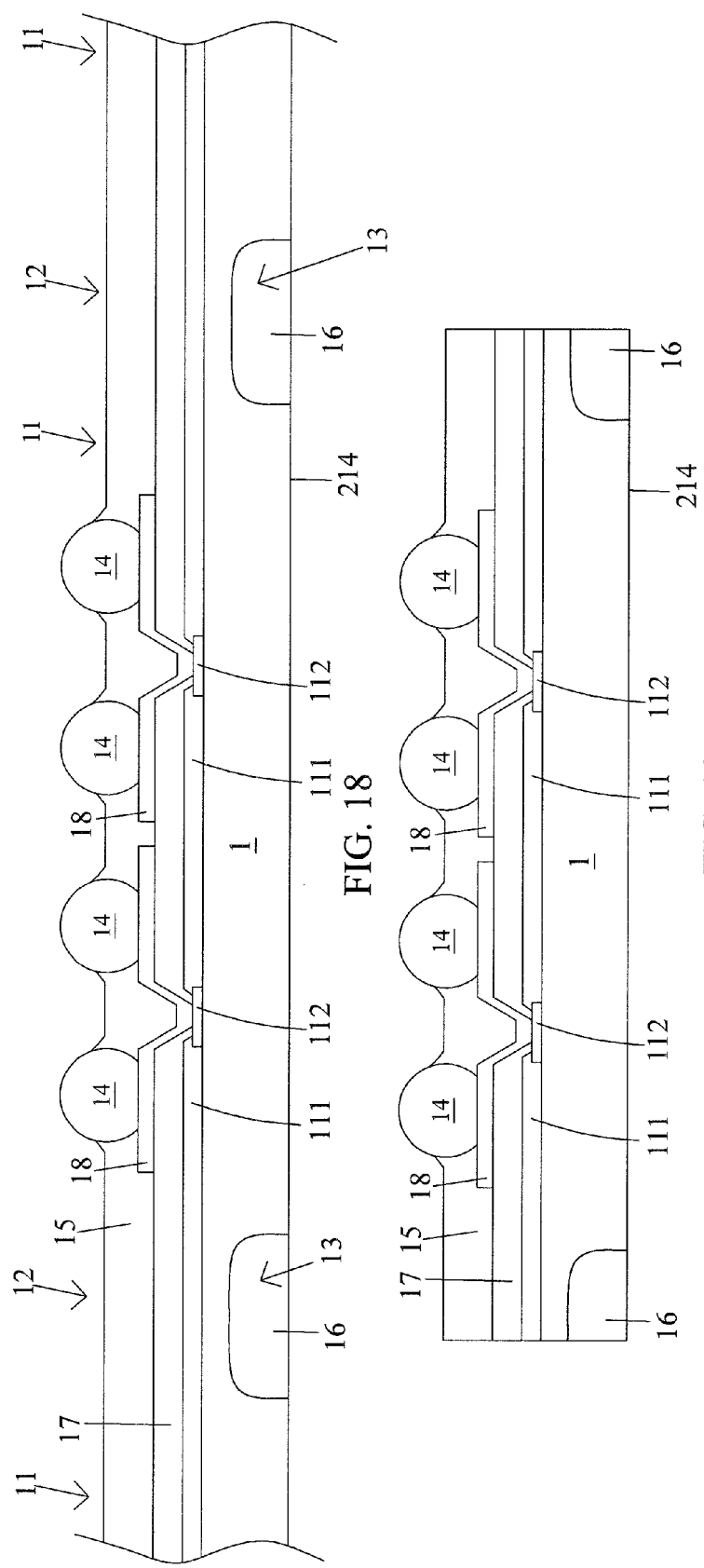

SEMICONDUCTOR DEVICE AND METHOD OF MANUFACTURING THE SAME

BACKGROUND

Disclosed embodiments are related to packages and methods of manufacturing the same, and more particular to wafer level chip scale packages (WLCSP) and methods of manufacturing the same.

An integrated circuit is a group of electronic circuits on a block of semiconductor material, usually silicon. Semiconductor integrated circuits are fabricated in a front-end process including operations of imaging, deposition, and etching, which are supplemented by doping and cleaning. Once the front-end process has been completed, a wafer is prepared for testing and packaging.

Many different packaging technologies have been developed, including wafer-level packaging technologies. The wafer-level packaging technologies are completed in the wafer form and individual units are finished after the wafer is sawed. In a wafer-level packaging technology, molding material is compressed against a thinned wafer after bumps are disposed on contact pads of the wafer. During compression molding, compression force generates stresses on the wafer, which likely damages thinner portions of the wafer.

Furthermore, conventional molding material cannot transmit light, including infrared light, and if alignment marks are covered by mold, the alignment marks cannot be utilized during a laser marking operation. Moreover, since conventional molding material blocks light, visual inspection is obstructed. Conventional molding material also has poor heat dissipation capability. In addition, when a wafer is diced through, chipping may occur, which may cause an adverse effect to critical areas of the wafer. The chipping may create shadows during inspection, and if so, an additional inspection operation is required to determine whether the shadows are actual defects.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 3A is a cross-sectional view illustrating a portion of a semiconductor device in accordance with some embodiments.

FIG. 3B is a cross-sectional view illustrating a portion of a semiconductor device in accordance with some embodiments.

FIG. 4 is a schematic view illustrating a part of a semiconductor device in accordance with some embodiments.

FIG. 4A is a schematic view illustrating a part of a semiconductor device with a V-shaped grove in accordance with some embodiments.

FIGS. 6 to 9 are schematic cross-sections used to demonstrate operations of a method of manufacturing a semiconductor device in accordance with some embodiments.

DETAILED DESCRIPTION

Figure 1:
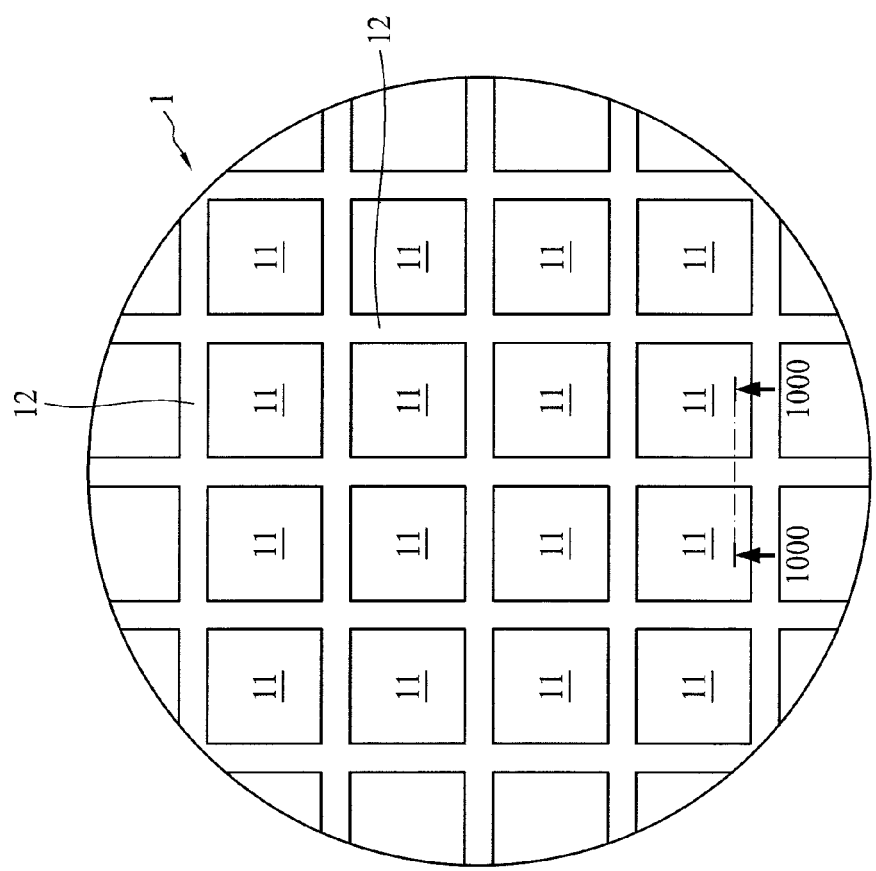
FIG. 1 is a schematic view illustrating a part of a wafer in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 2:
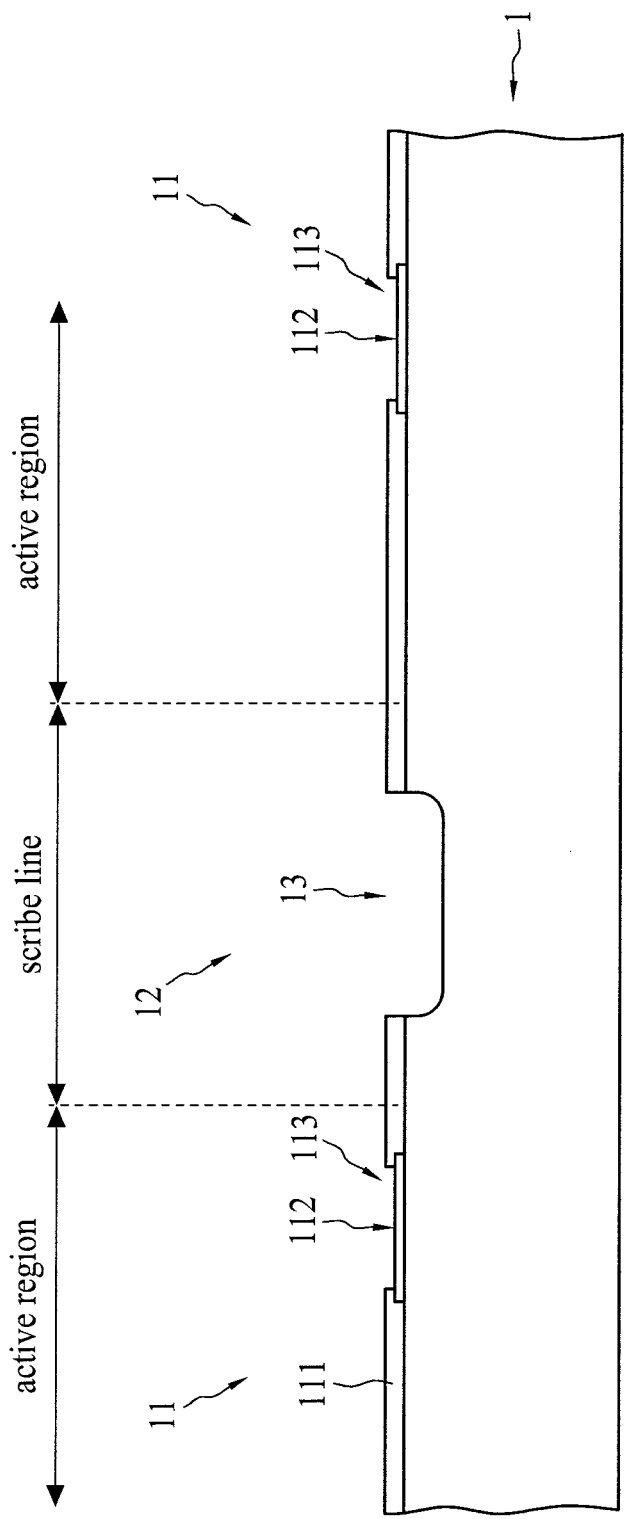
FIG. 2 is a cross-sectional view along line 1000-1000 of FIG. 1.

FIG. 1 is a schematic view illustrating a part of a wafer in accordance with some embodiments. FIG. 2 is a cross-sectional view along line 1000-1000 of FIG. 1.

A substrate 1 comprises a front side where integrated circuits are disposed and a back side formed with bulk semiconductor material or bulk silicon. The front side includes a plurality of active regions 11, each of the active regions 11 has corresponding integrated circuits. The front side is built by various processes including deposition, removal, patterning, and modification of electrical properties. A deposition grows, coats, or otherwise disposes a material onto the substrate 1, including physical vapor deposition, chemical vapor deposition, electrochemical deposition, molecular beam epitaxy, and atomic layer deposition. A removal takes away material from the substrate, including, for example, etch processes and chemical-mechanical planarization. Patterning shapes or changes of deposited materials involves masking areas of a deposited material and removing undesired parts of the deposited material. Modification of electrical properties injects dopant materials by diffusion furnaces or ion implantation.

In some embodiments, the substrate 1 comprises silicon. In some embodiments, the substrate 1 comprises a silicon wafer, a silicon-on-insulation (SOI) substrate, or a silicon germanium substrate. In some embodiments, the substrate 1 comprises a multi-layer or gradient substrate. In some embodiments, integral circuits comprise electronic circuits such as diodes, resistors, capacitors, fuses, inductors, active devices, passive devices, micro electro-mechanical systems components, or optical elements. In some embodiments, the integral circuits perform functions similar to those of memory structures, processing structures, sensors, amplifiers, power distribution, and input/output circuitry.

The front side of the substrate 1 includes active regions 11 separated by cutting streets or scribe lines 12. In some embodiments as in FIG. 2, the substrate 1 comprises a first passivation layer 111 on top of the substrate 1 and contact pads 112 exposed to the outside of the substrate 1 through corresponding openings 113 formed in the first passivation layer 111. The first passivation layer 111 is formed to cover edges of the contact pads 112. In some embodiments, the contact pad 112 includes at least one of copper (Cu) or aluminum (Al), but is not limited by the above-mentioned materials. The first passivation layer 111 is made of a dielectric material. In some embodiments, the first passivation layer 111 is formed of silicon oxide, silicon nitride, silicon oxynitride, undoped silicate glass, or a combination thereof, but is not limited to the above-mentioned materials.

Referring to FIG. 2, the scribe line 12 is provided to allow a saw to cut the substrate 1 without damaging the integrated circuits. The width of the scribe line 12 is usually in a range of 70 micrometers to 100 micrometers. A groove 13 is formed within and along a scribe line 12. The groove 13 is formed with a width larger than the width of a kerf created by a dicing saw. The groove 13 is formed before molding, but is not limited to being formed during packaging or the back-end process. The groove 13 can be formed in a radiative or mechanical manner. In some embodiments, the groove 13 is formed by a laser. In some embodiments, the groove 13 is formed by using a grooving process of the dicing technology.

When the groove 13 is formed on a corresponding scribe line 12, a part of the substrate material is removed. As a result, a portion of the scribe line 12 become thinner, and the thinner portion is vulnerable to stresses that occur during molding. In some embodiments, a plurality of grooves 13 are formed on the substrate 1, along corresponding scribe lines 12 between active regions 11 or semiconductor die locations. The plurality of grooves 13 are in a grid pattern, which comprises a group of mutually parallel grooves 13 arranged perpendicular to another group of grooves 13.

FIG. 3A and FIG. 3 are cross-sectional views illustrating a portion of a molded wafer in accordance with some embodiments.

Bump material 14 is respectively disposed to the contact pads 112 of the substrate 1 as external connection terminals. Before a mold 15 is formed on the substrate 1, a polymeric member 16 is disposed in the groove 13. The polymeric member 16 can protect the thinner portion of the scribe line 12 from being damaged or broken during molding.

A bump material 14 can be connected to a corresponding contact pad 112 by any interconnect structure. In some embodiments, a second passivation layer 17 is disposed on the first passivation layer 111 with the contact pads 112 partially exposed. In some embodiment, the second passivation layer 17 is a polymer layer, including BCB (benzocyclobutene), polybenzoxazole (PBO), polyimide (PI), or epoxy. Post passivation interconnects (PPI) 18 are respectively disposed on the contact pads 112 and the second passivation layer 17. The bump material 14 is respectively disposed on a portion of the PPI 18. In some embodiments, the bump material 14 comprises a solder ball, but is not limited to the above-mentioned feature. The solder ball can be transformed into a ball shape during a reflow process. In some embodiments, the bump material 14 comprises a lead-free pre-solder layer, SnAg, or a solder material including alloys of tin, lead, silver, copper, nickel, bismuth, or combinations thereof.

The polymeric member 16 can protect the thinner portions of the scribe lines 12 from being broken. The polymeric member 16 is disposed in the thinner portions of the scribe lines 12 in order to increase the thicknesses of the locations at the thinner portions of the scribe lines 12 so that the substrate 1 will not be easily broken during the formation of the mold 15. The polymeric member 16 can act as a buffer for underneath portions of the scribe lines 12 so as to protect the portions from being broken during the formation of the mold 15. The polymeric member 16 can be flexible or elastic. The polymeric member 16 can be softer than the substrate 1. The polymeric member 16 can be not as brittle as the substrate 1. In some embodiments, the polymeric member 16 is a polymer. In some embodiments, the polymeric member 16 is of a different material from the mold 15. In some embodiments, the polymeric member 16 is of a same material as the mold 15. In some embodiments, the polymeric member 16 comprises a molding compound. In some embodiments, the polymeric member 16 comprises epoxy or polybenzoxazole.

The mold 15 can be formed from a molding compound. The molding compound can be either in powder form or liquid form. The molding compound is deposited on the front side of the substrate 1 after the deposition of the bump material 14. The molding compound can be melted at a melting temperature at which the bump material 14 does not melt. In some embodiments, the molding compound comprises epoxy resin, but is not limited to the above-mentioned material.

In some embodiments as in FIG. 3A, the polymeric member 16 is disposed before the depositions of the bump material 14 and the mold 15. In some embodiments, the polymeric member 16 and the second passivation layer 17 are disposed in the same step or operation. In some embodiments, there is an interface 16a between the polymeric member 16 and the mold 15. In some embodiments as in FIG. 3B, the polymeric member 16 is disposed after the deposition of the bump material 14 while before the deposition of the mold 15. In some embodiments, there is an interface 16a between the polymeric member 16 and the mold 15.

FIG. 4 is a schematic view illustrating a part of a semiconductor device 2 in accordance with some embodiments. Referring to FIGS. 3A, 3B and 4, after the mold 15 is formed, the substrate 1 is separated into semiconductor devices 2. Each of the semiconductor devices 2 correspondingly includes an active region 11. As illustrated in FIG. 4, the semiconductor device 2 comprises a chip substrate 21, a polymeric member 16 and a mold 15. The mold 15 is formed over the chip substrate 21. The material 16 is formed between the chip substrate 21 and the mold 15 with a surface exposed outside of the semiconductor device 2, and the material 16 at least defines a side surface of the semiconductor devices 2 with the chip substrate 21 and the mold 15.

The chip substrate 21 includes a front surface 211, which includes at least one contact pad 112. The bump material 14 is formed over the chip substrate 21 and electrically connects to the at least one contact pad 112 in a corresponding manner. The mold 15 is formed around the bump material 14. The mold 15 is also formed and contacted with the polymeric member 16. In some embodiments, the polymeric member 16 is formed around the chip substrate 21. In some embodiments, the polymeric member 16 is formed along a side portion of the chip substrate 21. In some embodiments, the polymeric member 16 is formed and surrounds the front surface 211 of the chip substrate 21. In some embodiments, an interface is formed between the mold 15 and the polymeric member 16.

As illustrated in FIG. 4, in some embodiments, the chip substrate 21 further comprises side walls 210. In some embodiments, the front surface 211 of the chip substrate 21 is at least partially defined by the first passivation layer 111. The mold 15 is formed over the front surface 211 of the chip substrate 21, thereby covering the active region 11. The side wall 210 comprises a side surface 212 exposed outside of the semiconductor device 2 and a recessed edge 213 extending between the side surface 212 and the front surface 211. In some embodiments, the side surface 212 is formed after a singulation process. The polymeric member 16 is disposed by or in the recessed edge 213, and the mold 15 is disposed directly on the polymeric member 16. In some embodiments, the surface of the recessed edge 213 is completely covered by the polymeric member 16.

The recessed edge 213 can be an inclined portion of the side wall 210 of the chip substrate 21, and the polymeric member 16 is formed by the inclined portion. The recessed edge 213 can partially face upwards. The recessed edges 213 can be formed around the chip substrate 21. In some embodiments, the recessed edge 213 at least comprises a curved surface. In some embodiments, the recessed edge 213 comprises a laser-ablated surface. In some embodiments, the recessed edge 213 comprises a sawed pattern.

The polymeric member 16 can include a top surface 161 contacting and interfacing with the mold 15. In some embodiments, the top surface 161 is lower than the front surface 211 of the chip substrate 21. In some embodiments, the top surface 161 is higher than the front surface 211 of the chip substrate 21. In some embodiments, the top surface 161 and the front surface 211 of the chip substrate 21 are at the same level.

In some embodiments, the polymeric member 16 can be made of a same material as the second passivation layer 17. In some embodiments, the polymeric member 16 and the second passivation layer 17 are formed during the same operation or process step.

As shown in FIG. 4, in some embodiments, the semiconductor device 2 is separated by using a two step cutting process so that the side surface 212 has two substantially vertical sawed surfaces. In some embodiments, the semiconductor device 2 is separated by a single cutting process.

As illustrate in FIG. 4, the semiconductor device 2 comprises a chip substrate 21, a redistribution structure 51, a bump material 14, a mold 15 and a polymeric member 16. The redistribution structure 51 is formed over the chip substrate 21. The redistribution structure 51 is formed on a second passivation layer 17 and electrically connecting the corresponding contact pad 112. The first passivation layer 111 covers the edge of the contact pad 112. An opening is defined over a portion of the redistribution layer 51 for receiving the bump material 14. The bump material 14 is formed directly on the exposed portion of the redistribution layer 51 so as to electrically connect the contact pad 112. The mold 15 is formed over the front surface 211 of the chip substrate 21, and the bump material 14 partially protrudes from the mold 15. The polymeric member 16 peripherally surrounds the chip substrate 21, and contacts with the chip substrate 21 and the mold 15. In some embodiments, the second passivation layer 17 comprises a polymer material. In some embodiments, the second passivation layer 17 comprises PBO, BCB, PI, epoxy, or a photo-sensitive resin, but is not limited to the above-mentioned materials. In some embodiments, the polymeric member 16 is made of a material different from or same as the mold 15. In some embodiments, the material for forming the polymeric member 16 and the second passivation layer 17 is disposed in the same operation. In some embodiments, the polymeric member 16 and the second passivation layer 17 is disposed in the same operation. In some embodiments, the polymeric member 16 is disposed after the deposition of the bump material 14 while before the deposition of the mold 15. In some embodiments, the redistribution layer 51 includes, but is not limited to, copper, aluminum, or copper alloy. In some embodiments, the redistribution layer 51 may further include a nickel-containing layer on top of a copper-containing layer. In some embodiments, the redistribution layer 51 includes an adhesion layer and a seed layer on the adhesion layer. The adhesion layer includes at least one of titanium (Ti), titanium nitride (TiN), tantalum (Ta), or tantalum nitride (TaN), but is not limited by the above-mentioned materials. The adhesion layer may be formed by a physical vapor deposition (PVD) process. The seed layer includes at least one of copper, aluminum, silver, gold, or nickel, but is not limited by the above-mentioned materials. The seed layer is formed by a PVD process. In some embodiments, the redistribution layer 51 may function as power lines, inductors, capacitors, or any passive components.

In some embodiments, the groove 13 can be formed by using other tools aside from a laser. In some embodiments, the groove 13 can be a bevel cut formed by using a V-shaped dicing blade in order to transform the recessed edge 213 into a chamfer or a beveled edge, or can comprise a plane surface, as shown in FIG. 4A. In some embodiments, a beveled groove of the semiconductor device 2 can be chemically formed along a corresponding scribe line 12.

Figure 5:
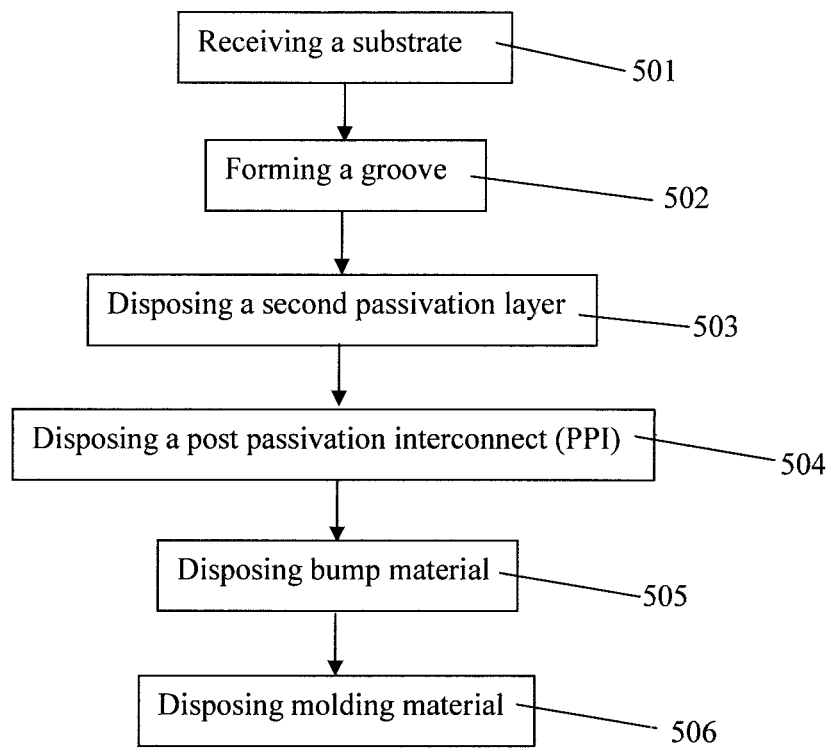
FIG. 5 is a flow chart related to a method of manufacturing a semiconductor device in accordance with some embodiments.
Figure 8:
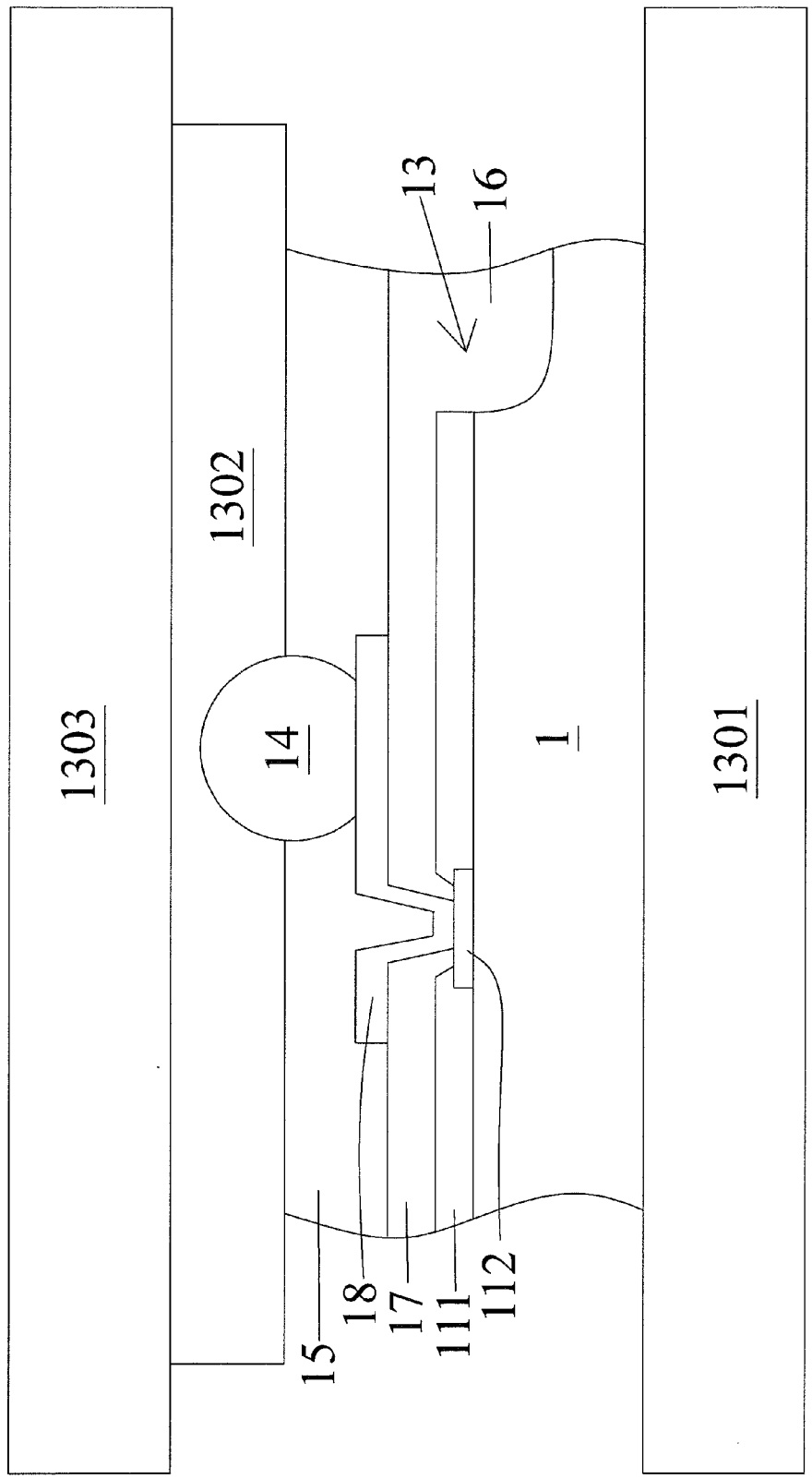

FIG. 5 is a flow chart related to a method of manufacturing a semiconductor device in accordance with some embodiments. FIGS. 6 to 8 are schematic cross-sections used to demonstrate operations of a method of manufacturing a semiconductor device in accordance with some embodiments.

Referring to FIGS. 5 and 6, in operation 501, a substrate 1 is received. The substrate 1 comprises at least one active region 11 In one or more embodiments, the active region 11 comprises at least one contact pad 112, which is used to electrically connect to external connections, for example, a solder ball. The substrate 1 comprises a first passivation layer 111 on its top. The first passivation layer 111 can protect integral circuits on the substrate 1. The first passivation layer 111 defines openings so as to expose the corresponding contact pads 112. The first passivation layer 111 may partially cover the contact pad 112.

In operation 502, a groove 13 is formed on the front side of the substrate 1 and along a corresponding scribe line 12. In some embodiments, the groove 13 can be formed in chemical or physical methods. In some embodiments, the groove 13 can be formed either by laser or saw cutting.

Alternatively, a method in another embodiment starts receiving a substrate, including a groove formed along a corresponding scribe line of the substrate. Therefore, another method does not need an operation to form the groove.

Referring to FIGS. 5 and 7, in operation 503, a second passivation layer 17 is disposed over the substrate 1 and patterned to remove undesired portions. The second passivation layer 17 can be disposed by, for example, a spin coating process. The second passivation layer 17 can be PBO, BCB, PI, epoxy, or a photo-sensitive resin, but is not limited to the above-mentioned materials. The patterning of the second passivation layer 17 may use a hard mask, which is a physically deposited and structured metal layer, or a thick photoresist coating.

In some embodiments as in FIG. 7, a groove 13 is filled by the second passivation layer 17 upon disposing the second passivation layer 17 over the substrate 1. In other words, the groove 13 is filled by a material 16 same as the second passivation layer 17. In some embodiments as in FIG. 7A, the groove 13 is filled after disposing the second passivation layer 17. In some embodiments, the groove 13 is filled by dispensing, printing or spin-coating. In some embodiments, the groove 13 is filled by polymer, resin, epoxy, molding compound or organic material.

Referring to FIGS. 5 and 7, in operation 504, a post passivation interconnect (PPI) 18 is formed over the second passivation layer 17, thereby contacting with the contact pad 112. The PPI 18 may comprise multiple sub-layers. The PPI 18 may comprise an adhesion layer and a seed layer on the adhesion layer. The adhesion layer and the seed layer may be formed by using a PVD process. The adhesion layer may be made of Ti, TiN, Ta, or TaN. The seed layer may be made of Cu, Al, Ag, Au, or Ni.

In operation 505, a bump material 14 is disposed over each active region 11 of the substrate 1. In some embodiments, bump material 14 can be disposed by evaporation, printing, electroplating, stud or ball bumping, ball placement, or solder transfer. In some embodiments, the bump material is then transformed into solder balls by a reflow process.

In some embodiments, the groove 13 is filled by the polymeric member 16 after the disposing the bump material 14. In some embodiments, the groove 13 is filled by an epoxy after disposing the bump material 14 on an exposed portion of the PPI 18.

Figure 9:
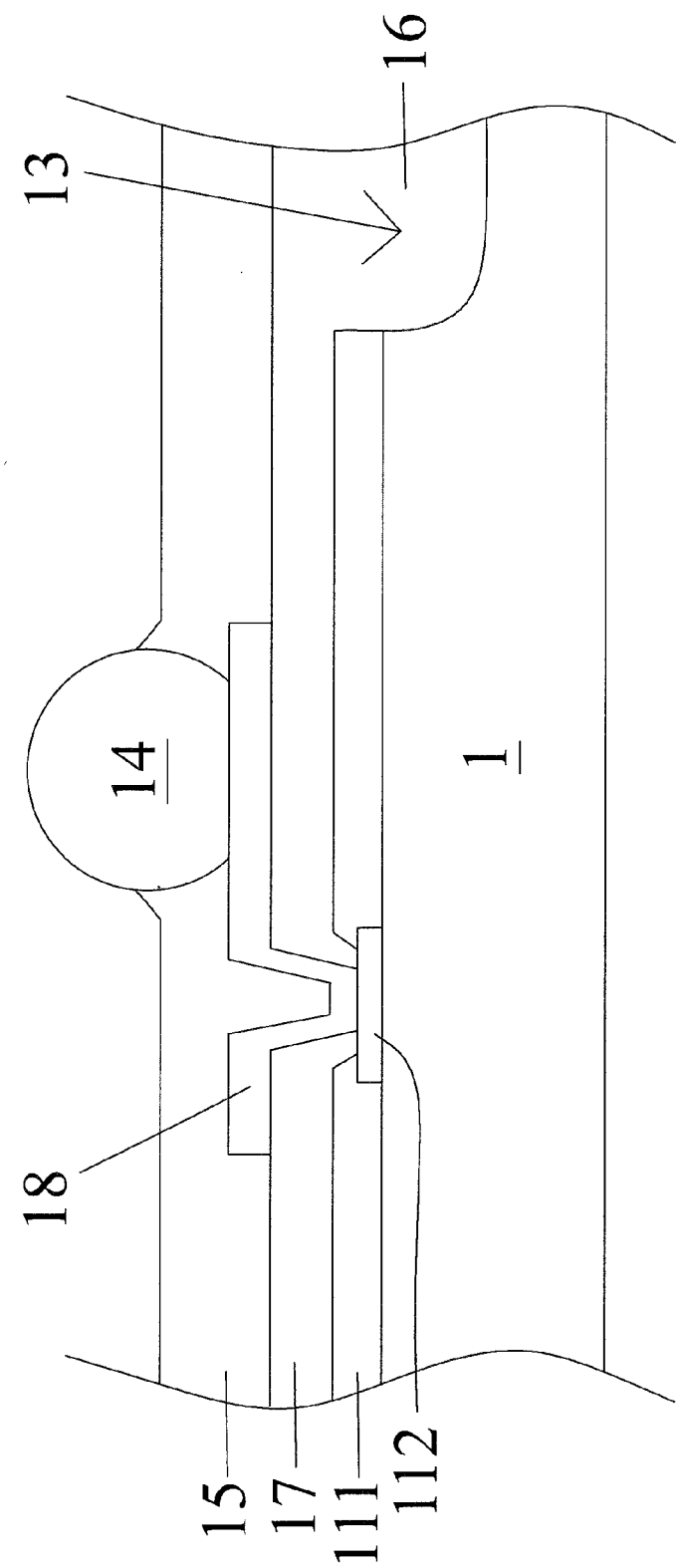

In operation 506, a mold 15 is disposed over the substrate 1 and fills between bump materials 14. In some embodiments as in FIG. 8, the substrate 1 is placed over a bottom chase 1301. Molding material, for example, a liquid molding compound, is disposed over the substrate 1. A top chase 1303 and the bottom chase 1301 are brought together so as to spread the molding material by a release film 1302 and form a mold 1304 in order to cover the entire substrate 1. The top chase 1303 and/or the bottom chase 1301 may be heated in order to cure the molding material. Since the groove 13, which is the thinner portion of the substrate 1, contains the polymeric member 16, the molding material does not directly apply force on the groove 13 so that the substrate 1 can be protected from being broken through the thinner portion. After curing of the molding material, the top chase 1303 and the bottom chase 1301 are removed, and then the mold 15 is formed as in FIG. 9.

Alternatively, in some embodiments, the polymeric member 16 can instead be disposed before any operation that is performed prior to the formation of the mold 15.

The above-mentioned method can be adapted to form semiconductor devices with structures built by other bumping technologies rather than that forming the structure of the embodiments of FIGS. 6 to 9.

Figure 10:
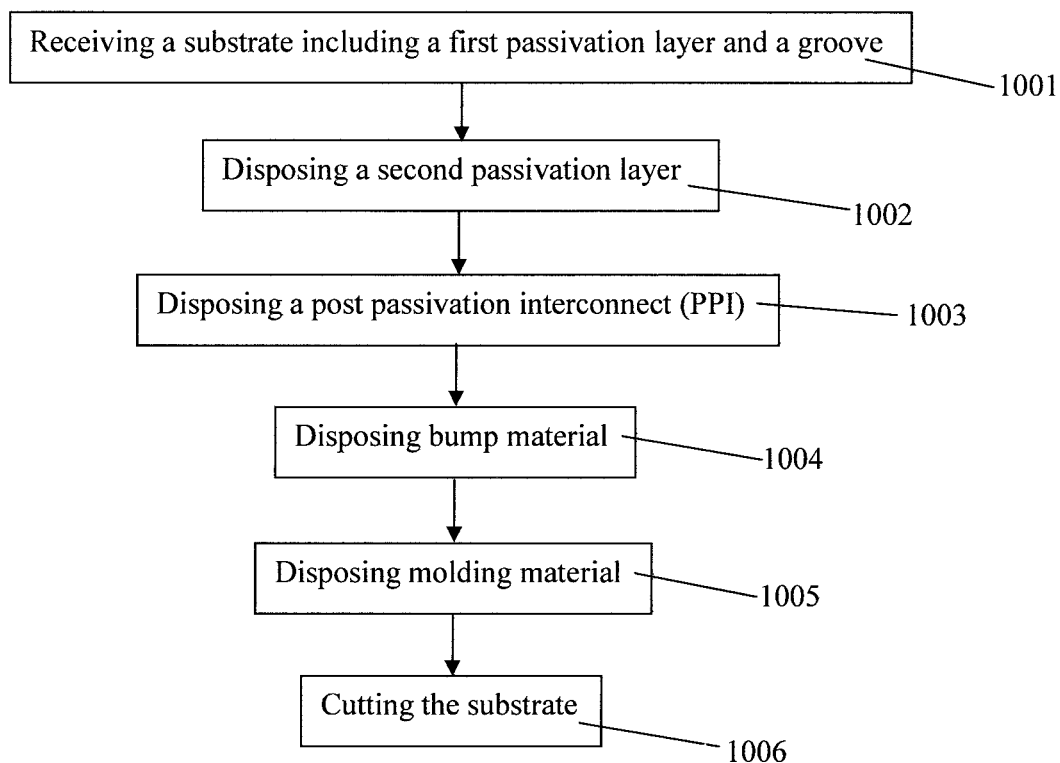
FIG. 10 is a flow chart related to another method of manufacturing a semiconductor device in accordance with some embodiments.

FIG. 10 is a flow chart related to another method of manufacturing a semiconductor device in accordance with some embodiments. FIGS. 11 to 20 are schematic cross-sections used to demonstrate operations of another method of manufacturing a semiconductor device in accordance with some embodiments.

Figure 11:
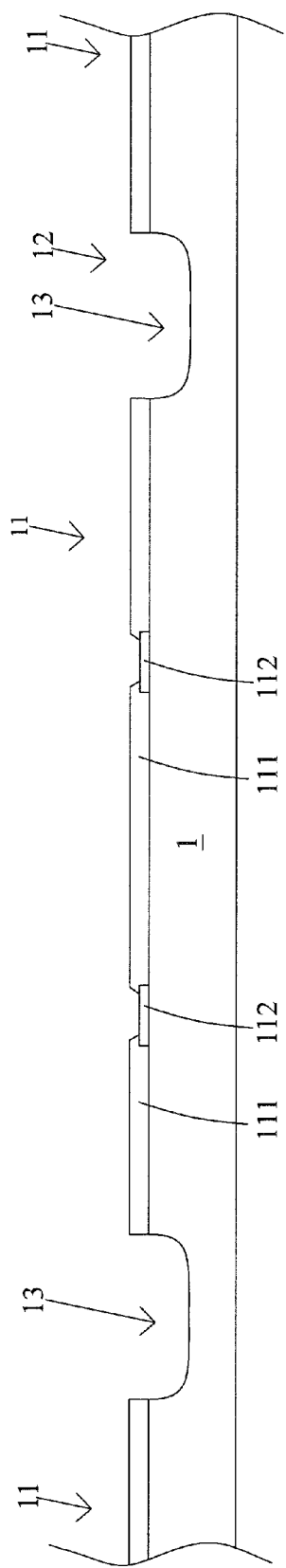
FIGS. 11 and 21 are schematic cross-sections used to demonstrate operations of another method of manufacturing a semiconductor device in accordance with some embodiments.

Referring to FIG. 11, in operation 1001, a substrate 1 is received. The substrate 1 comprises at least one active region 11, at least one scribe line 12 disposed next to the at least one active region 11, and a groove 13 formed along the scribe line 12. Each active region 11 includes at least one contact pad 112 and a first passivation layer 111, which may partially cover the contact pad 112. The groove 13 can be formed by laser or saw cutting.

Figure 12:
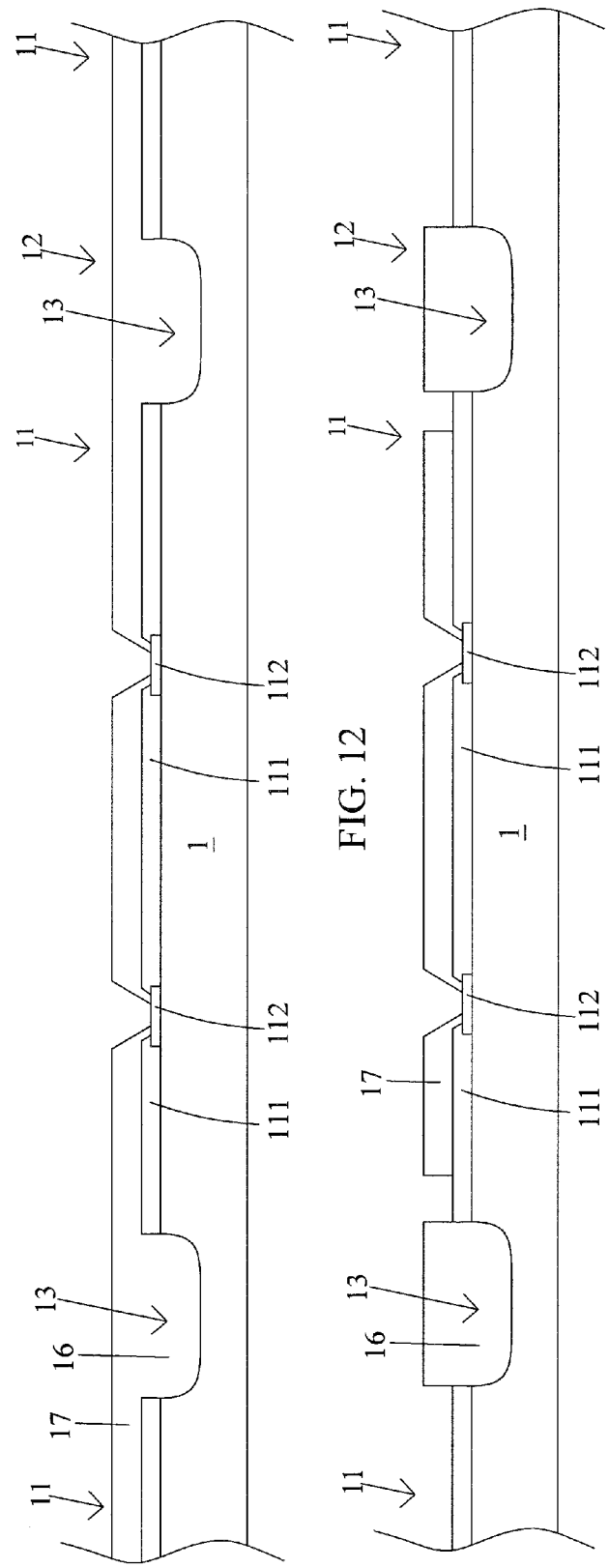

In operation 1002, a second passivation layer 17 is disposed over the first passivation layer 111 as in FIG. 12 and FIG. 12A. In some embodiments, the second passivation layer 17 forms openings in order to expose a portion of each contact pad 112 for subsequent electrical connection. In some embodiments as in FIG. 12, the groove 13 is filled upon disposing the second passivation layer 17. The groove 13 is filled by a polymeric member 16 same as the second passivation layer 17. In some embodiments as in FIG. 12A, the groove 13 is not filled upon disposing the second passivation layer 17.

Figure 13:
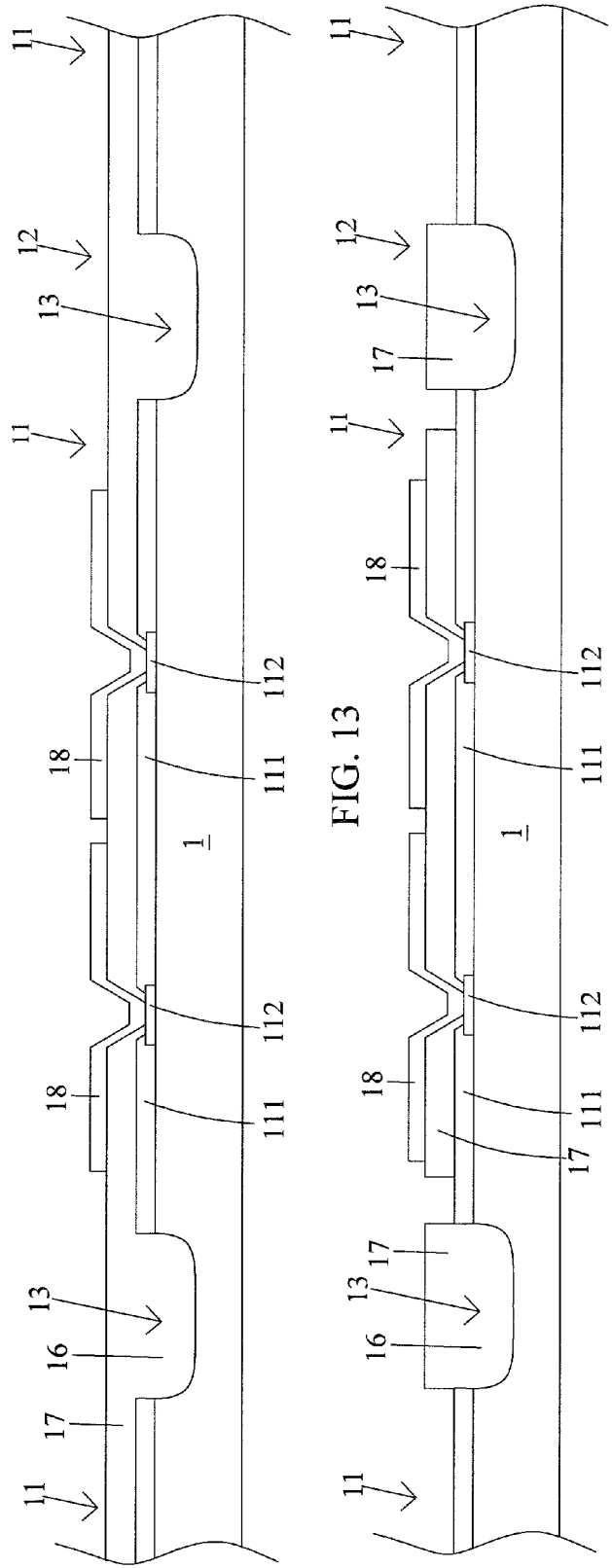

In operation 1003, at least one post passivation interconnect (PPI) 18 is formed over the substrate 1, thus contacting the corresponding contact pad 112 as shown in FIGS. 13 and 13A.

Figure 14:
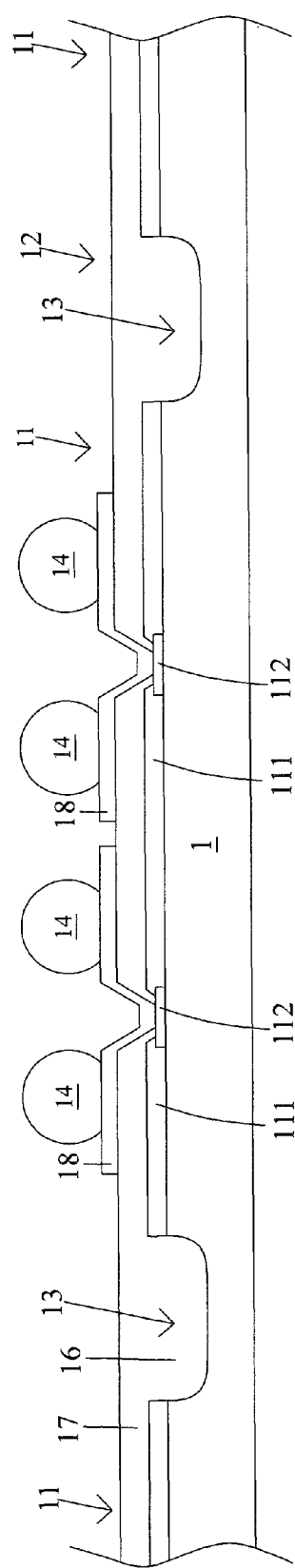

In operation 1004, bump material 14 is disposed over the exposed portion of the PPI 18 as in FIG. 14. In some embodiments, the bump material is then transformed into solder balls by a reflow process.

Figure 15:
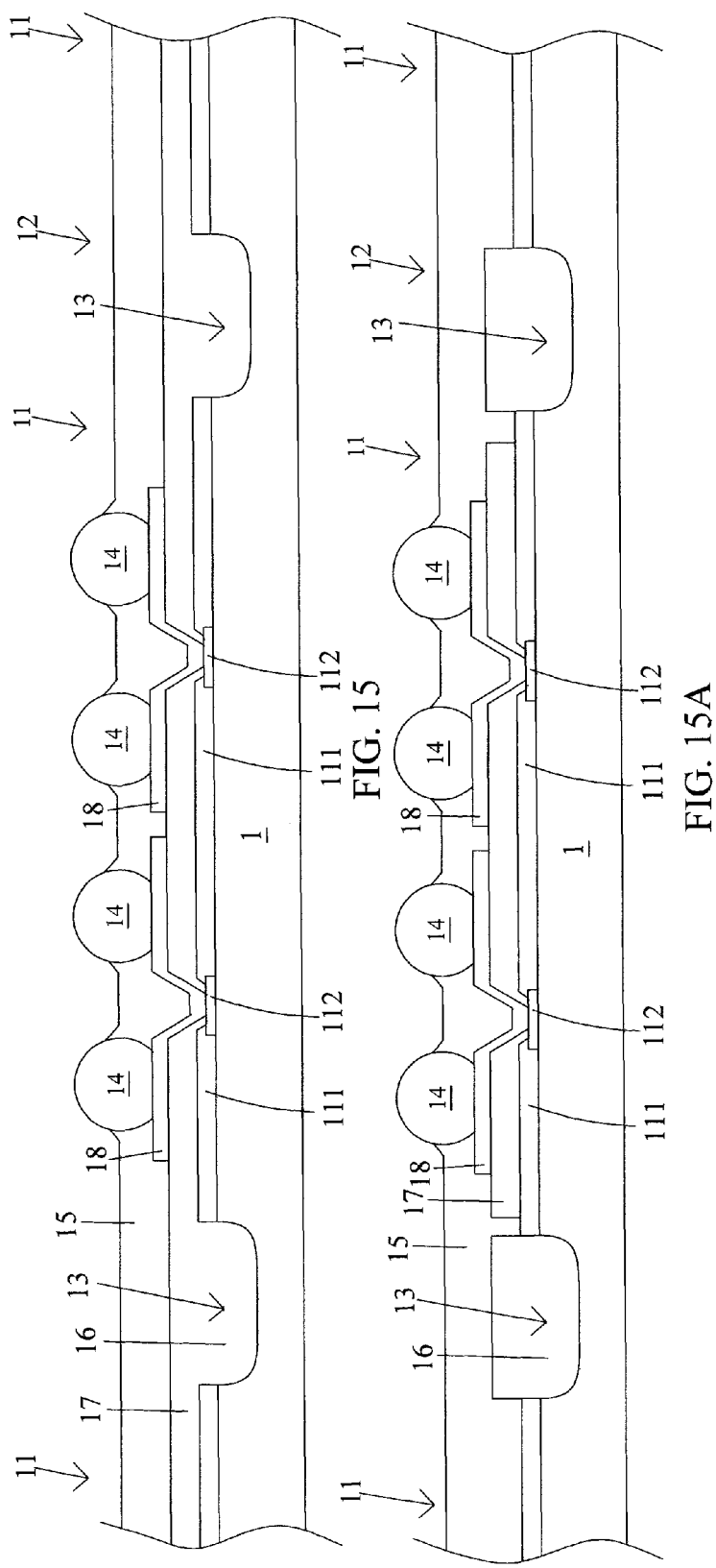

In operation 1005, molding material is disposed to form a mold 15 as in FIG. 15. The molding material contacts the second passivation layer 17. In some embodiments, the molding material covers the entire substrate 1 and cured to form the mold 15.

In some embodiments as in FIG. 15A, the groove 13 is filled by the polymeric member 16 such as epoxy after the deposition of the second passivation layer 17 but before the formation of the mold 15. In some embodiments, the groove 13 is filled before or after the deposition of the bump material 14.

In operation 1006, the substrate 1 is cut by using a laser or at least one dicing saw to become the semiconductor device as in FIG. 16 and FIG. 16A. In some embodiments, a mechanical or laser blade is cut along the scribe line 12, within the groove 13, so that a portion of the polymeric member 16 in the groove 13 is left in the semiconductor device, exposed externally and located between the substrate 1 and the mold 15. In some embodiments, the substrate 1 is cut by a two step cutting process, such that an edge of the semiconductor device is in a step profile as in FIG. 16A.

Due to the existence of the polymeric member 16 in the groove 13, edge cracking or chipping along the back side of the semiconductor device can be significantly reduced, and the critical area or region of the semiconductor device can be protected.

In some embodiments, a protective layer is provided to cover the bump material 14 and the front side of the substrate 1 so as to protect the bump material 14 and the substrate 1 from damage upon the cutting operation.

In some embodiments, a back side grinding operation is performed before the cutting of the substrate 1. In some embodiments as in FIG. 17, a back surface 214 of the substrate 1 is ground and thinned down in thickness until reaching a portion of the groove 13 or the polymeric member 16 to become a back surface 214' of the substrate 1. After the back side grinding operation, the substrate 1 is cut along the scribe line 12 to become the semiconductor device as in FIG. 17A.

In some embodiments, polymeric member 16 has a thickness t, which can be in a range of from a subtraction of 20 micrometers from the thickness of the substrate 1 to a subtraction of 10 micrometers from the thickness of the substrate 1. In some embodiments, the thickness t is between 50 and 70 micrometers.

In some embodiments, the edge of the substrate 1 is covered by the polymeric member 16 without being covered by the mold 15. Therefore, alignment marks on the substrate 1 can be easily utilized for, such as, a laser marking alignment process. Furthermore, the polymeric member 16 is made of material that at least transmits infrared light such that an inspection can be performed through the polymeric member 16. In addition, the polymeric member 16 is made of material having a sufficient heat dissipation capability. Therefore, heat generated by the semiconductor device can be easily dissipated. Also, the polymeric member 16 acts as a buffer such that the portion of the substrate 1 below the groove 13 is subjected to less stress or impact from the application of a molding material, and therefore, the substrate 1 will not be easily damaged or broken at the groove during molding operation.

Figure 17B:
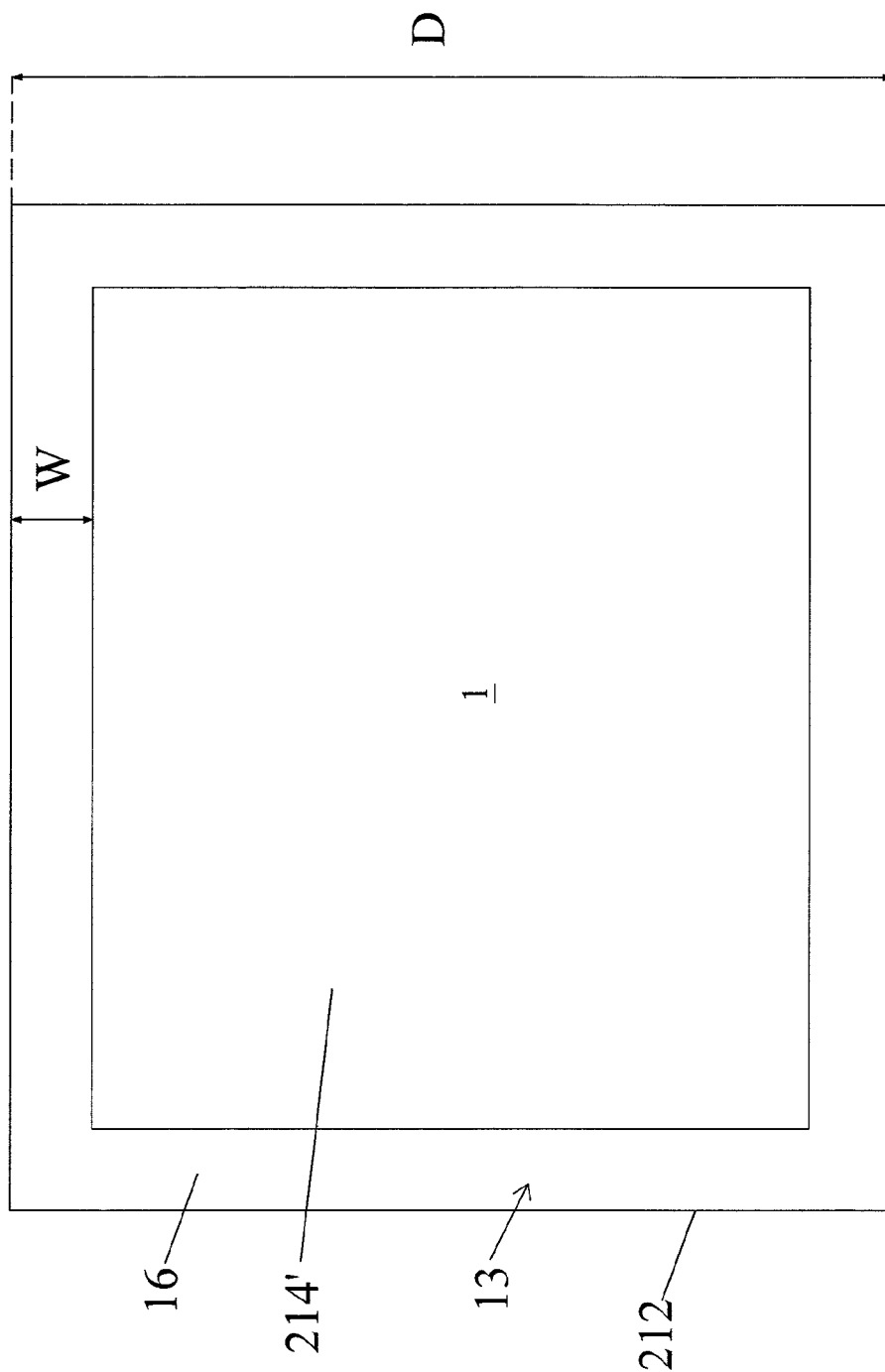

FIG. 17B is a bottom view of the semiconductor device of FIG. 17A. In some embodiments, the substrate 1 includes a dimension D measured between any two opposite side surfaces 212. The polymeric member 16 does not completely cover the back surface 214 and includes a width w not less than 10 percent of a dimension D or 20 micrometers.

FIG. 18 is a schematic view illustrating another semiconductor device in accordance with some embodiments. The semiconductor device of FIG. 18 is similar to that of the embodiment of FIG. 15A, except that the groove 13 is extended from the back surface 214 and is filled by the polymeric member 16. At least one groove 13 is formed correspondingly to the at least one scribe line 12. In some embodiments, the groove 13 is formed in chemical or physical methods. In some embodiments, the groove 13 is formed by laser or saw cutting.

The substrate 1 is then cut to become the semiconductor device of FIG. 19. In some embodiments, the polymeric member 16 can be polymer or organic material. In some embodiments, the polymeric member 16 is transmissible to a light for alignment during a packaging process. In some embodiments, the polymeric member 16 is transmissible to infrared light. In some embodiments, the polymeric member 16 can dissipate heat easier than traditional backside lamination coatings or molding material. In some embodiments, the polymeric member 16 can be resin, a photoresist, PBO, epoxy, or molding compound, but is not limited to the above-mentioned materials.

Figure 20:
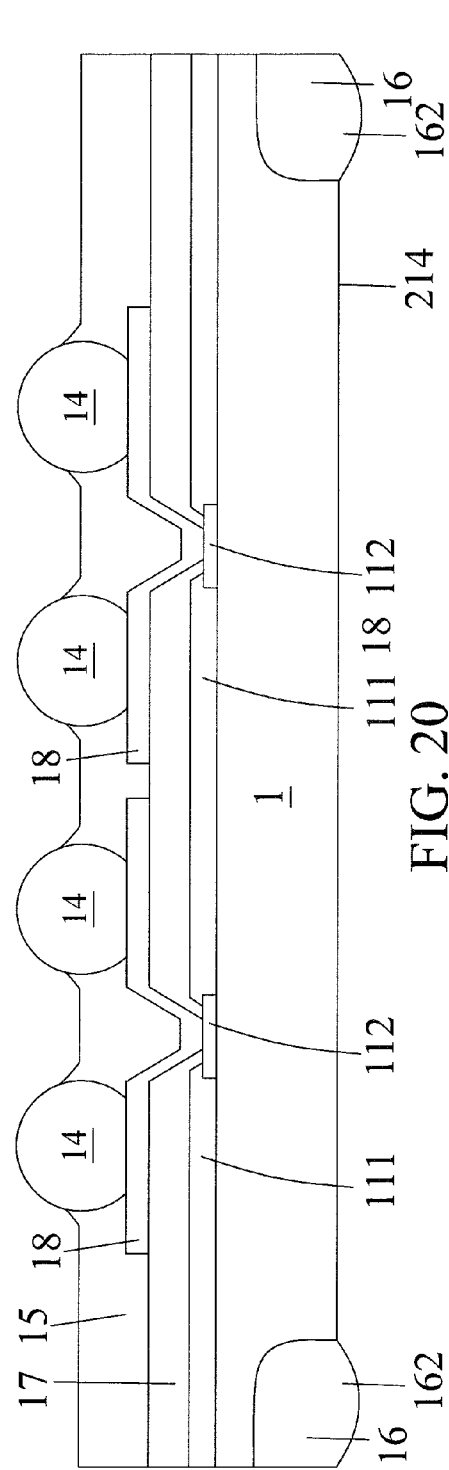
Figure 21:
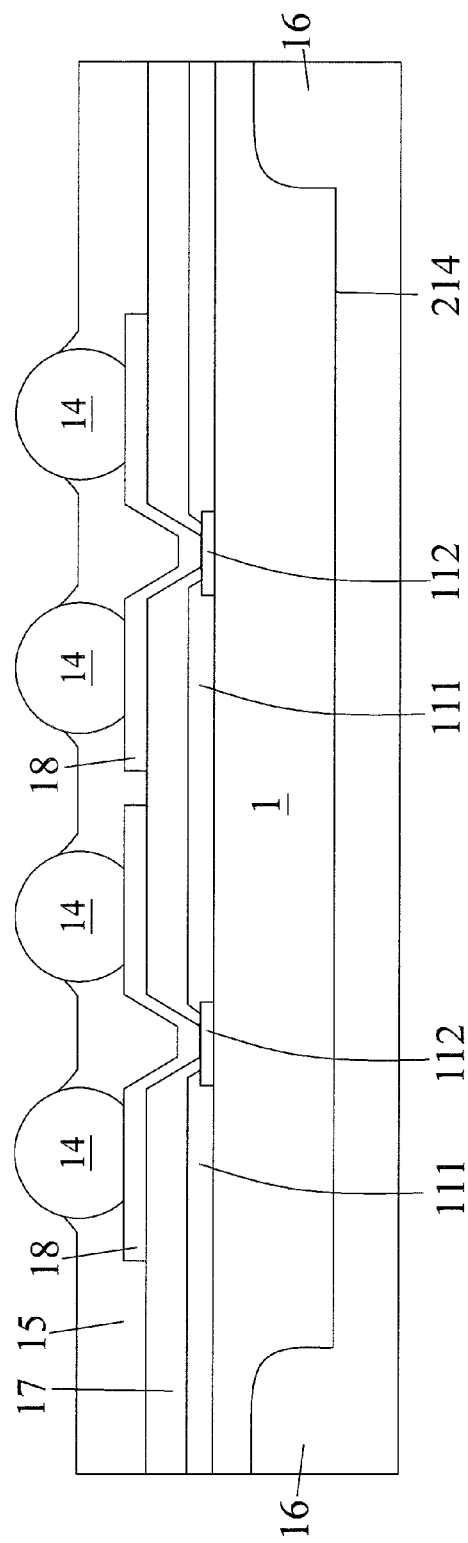

FIG. 20 is a schematic view illustrating the semiconductor device with the polymeric member 16 protruded from the back surface 214 of the substrate 1. A protruding portion 162 of the polymeric member 16 provides support when the semiconductor device is placed on a surface or an additional semiconductor device, with its back surface 214 facing the surface or the additional semiconductor device. The protruding portion 162 supports the substrate 1, thereby keeping the substrate 1 away from contacting the surface or the additional semiconductor device so as to allow the semiconductor device to be easily handled or picked and placed, and to protect the semiconductor device from being damaged.

In some embodiments, the polymeric member 16 of the semiconductor device not only fills the groove 13, but also extends over the back surface 214 of the semiconductor device, covering the back surface 214 of the semiconductor device. As such, the polymeric member 16 can further protect the substrate 1 of the semiconductor device. In some embodiments, the polymeric member 16 completely covers the back surface 214 of the semiconductor device. In some embodiments, the polymeric member 16 partially covers the back surface 214 of the semiconductor device.

In some embodiments, a semiconductor device includes a substrate and a non-molded element. The chip substrate comprises a front surface, side surfaces, a back surface, and a recessed edge. The recessed edge can be located between the side surfaces and the front surface, or between the side surfaces and the back surface. The front surface comprises an active region. The active region may comprise at least one contact pad. The polymeric member is disposed and contacted with the recessed edge of the substrate. The semiconductor device includes a mold disposed over the front surface of the substrate and the polymeric member, and an interface between the mold and the polymeric member.

In some embodiments, a method of manufacturing a semiconductor device is disclosed. In the method, a substrate is received, wherein the substrate has at least one active region and at least one scribe line. A groove is formed along the scribe line of the substrate. A bump material is disposed over the active region of the substrate. A polymeric member is disposed to the groove. A mold is disposed around the bump material and on the polymeric member. The substrate is cut along the groove.

In some embodiments, a method of manufacturing a semiconductor device is disclosed. The method is used to receive a substrate, which comprises a front side, a back side, at least one active region on the front side, and at least one scribe line on the front side. The method is then used to form a groove on the backside of the substrate and along the scribe line. The method is next used to dispose a polymeric member into the groove. The method is then used to cut the wafer along the groove.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
a substrate comprising a front surface, side surfaces, a back surface, and a recessed edge between the side surfaces and either the front surface or the back surface, the front surface comprising an active region, the active region comprising at least one contact pad;
a polymeric member disposed and contacted with the recessed edge of the substrate;
a mold disposed over the front surface of the substrate and the polymeric member; and
an interface between the mold and the polymeric member.

2. The semiconductor device of claim 1, further comprising a bump material and a post passivation interconnect (PPI) between the mold and the substrate.

3. The semiconductor device of claim 2, wherein the PPI comprises a redistribution layer electrically connecting the bump material and the contact pad, and a passivation layer is disposed below or over the PPI, wherein the passivation layer and the polymeric member are of a same material.

4. The semiconductor device of claim 1, wherein the substrate comprises a silicon portion having a thickness, and a thickness of the polymeric member is between a subtraction of 20 micrometers from the thickness of the silicon portion and a subtraction of 10 micrometers from the thickness of the silicon portion.

5. The semiconductor device of claim 1, wherein the substrate comprises a silicon portion having a dimension between two opposite ones of the side surfaces, and a width of the polymeric member is not less than 10 percent of the dimension or 20 micrometers.

6. The semiconductor device of claim 1, wherein the recessed edge is between the back surface and the side surfaces of the chip substrate, wherein the polymeric member protrudes beyond the back surface of the substrate.

7. The semiconductor device of claim 1, wherein the recessed edge is between the back surface and the side surfaces of the substrate, wherein the polymeric member covers the back surface of the substrate.

8. A semiconductor device, comprising:
a substrate including a front surface;
a contact pad disposed over the front surface of the substrate;
a passivation layer disposed over the front surface of the substrate, partially covering the contact pad, and including a recessed portion extended from the front surface and recessed into the substrate;
a post passivation interconnect (PPI) disposed over the passivation layer and electrically connected with the contact pad;
a bump material disposed over and electrically connected with the PPI; and
a mold disposed over the passivation layer, covering the PPI and surrounding the bump material.

9. The semiconductor device of claim 8, wherein the recessed portion is disposed between the mold and the substrate, and extended within the substrate.

10. The semiconductor device of claim 8, wherein the recessed portion is at least partially surrounded by the substrate.

11. The semiconductor device of claim 8, wherein the recessed portion includes a side surface exposed outside of the semiconductor device.

12. The semiconductor device of claim 8, wherein the recessed portion is flexible or elastic.

13. The semiconductor device of claim 8, wherein the passivation includes polymer.

14. The semiconductor device of claim 8, wherein an interface between the mold and the passivation is substantially parallel to the front surface of the substrate.

15. A semiconductor device, comprising:
a substrate including a contact pad disposed over the substrate;
a first passivation layer disposed over the substrate and partially covering the contact pad;
a second passivation layer disposed over the first passivation layer and partially covering the contact pad;
a post passivation interconnect (PPI) disposed over the second passivation layer and electrically connected with the contact pad;
a bump material disposed over and electrically connected with the PPI;
a mold disposed over the first passivation layer and the second passivation layer, covering the PPI and surrounding the bump material; and
a polymeric member extended between the mold and the substrate and recessed into the substrate.

16. The semiconductor device of claim 15, wherein a portion of the mold is disposed between the second passivation layer and the polymeric member.

17. The semiconductor device of claim 15, wherein the polymeric member is integrally or separately formed with the second passivation layer.

18. The semiconductor device of claim 15, wherein the polymeric member includes material different from or same as the first passivation layer or the second passivation layer.

19. The semiconductor device of claim 15, wherein polymeric member includes a side surface exposed outside of the semiconductor device.

20. The semiconductor device of claim 15, wherein the substrate includes a protrusion laterally protruded from a sidewall of the semiconductor device and away from the polymeric member.

* * * * *